United States Patent [19]

Nair

[11] Patent Number: 4,477,296

[45] Date of Patent: Oct. 16, 1984

[54] METHOD FOR ACTIVATING METAL PARTICLES

[75] Inventor: Kumaran M. Nair, East Amherst, N.Y.

[73] Assignee: E. I. Du Pont de Nemours and Company, Wilmington, Del.

[21] Appl. No.: 430,871

[22] Filed: Sep. 30, 1982

[51] Int. Cl.$^3$ .......................... C23C 1/10; C22C 1/04; B22F 9/00; C22B 11/04
[52] U.S. Cl. .............................. 148/6.14 R; 75/0.5 A; 148/6.15 R; 148/6.27; 252/513; 252/514
[58] Field of Search ..................... 148/6.15 R, 6.14 R, 148/6.27; 427/79, 80, 216; 75/0.5 A; 252/512–514

[56] References Cited

U.S. PATENT DOCUMENTS 3,617,253 11/1971 Amiet ................................ 75/0.5 A
3,771,996 11/1973 Short ................................ 75/0.5 A
3,992,192 11/1976 Vartanian ........................ 75/0.5 BA

*Primary Examiner*—Michael R. Lusignan

[57] ABSTRACT

A method for activating the surface of finely divided particles of conductive metals having a thin surface coating of an oxide of the conductive metal comprising the steps of (a) treating the surface with an aqueous solution of a reducing agent when the conductive metal is a noble metal and either a reducing agent for the oxide or an inorganic acid when the conductive metal is a base metal, (b) washing the surface of the treated particles with an aqueous liquid, and (c) drying the surface of the washed particles.

8 Claims, 2 Drawing Figures

METHOD FOR ACTIVATING METAL PARTICLES

FIELD OF THE INVENTION

The invention relates to a method for activating finely divided metal particles to make them more effective in electronic applications.

BACKGROUND OF THE INVENTION

It is well known that clean metal surfaces have a high surface energy which results in a strong gradient toward a lower energy state. Such surfaces easily adsorb gases such as oxygen which react chemically with strongly electropositive metal atoms to form a strongly bonded oxide layer on the surface (see Pask, *Glass-Metal "Interfaces" and Bonding*, U. of California, Lawrence Radiation Laboratory, Berkeley, Calif., Report UCRL 10611, 1963). By virtue of this mechanism, most metal surfaces which have been cleaned contain a layer of oxide. Such metal oxides have a considerably higher sintering temperature than the underlying metal. Thus, when mixtures of finely divided particles of metals are fired to effect alloying of the metals, it is found that the oxide layer interferes with the alloying function. This, in turn, results in significant quantities of unalloyed metal in the sintered body.

One field for the use of finely divided conductive metal particles in which the activity of the particles is of crucial importance is the fabrication of monolithic capacitors.

Monolithic capacitors comprise a plurality of dielectric layers, at least two of which bear metallizations (electrodes) in desired patterns. Such capacitors are made from a green (unfired) tape of particles of dielectric materials held together with an organic binder by cutting pieces of tape from a sheet of tape, metallizing some of the tape pieces, stacking and laminating the pieces of tape, cutting the laminates to form individual capacitors and firing the resultant capacitors to drive off any organic binders and vehicles and form a sintered (coherent) body.

Metallizations useful in producing electodes for capacitors normally comprise finely divided metal particles applied to dielectric green tapes in the form of a dispersion of such particles in an inert liquid organic medium or vehicle. Selection of the composition of the metal particles is usually based on a compromise of cost and performance. Performance usually requires the use of the noble metals because they are relatively inert during firing of the laminates to produce electrically continuous conductors. On the other hand, base metals often are oxidized in air at elevated temperatures and/or in many cases react with the dielectric material during firing.

As can be seen by reference to FIG. 1 of the drawing, the electrode layers of a typical multilayer capacitor unfortunately are not homogeneous and even, but are relatively porous. When all other parameters are the same, the capacitance of a particular multilayer capacitor is related to the area of the electrode layer. Therefore, to raise the capacitance for a given multilayer capacitor system, one must either increase the amount of the noble metal laydown to fill in the pore-like gaps in the electrode layer or improve the coverage of the electrode material over the dielectric material.

BRIEF DESCRIPTION OF THE INVENTION

The invention is, therefore, directed generally to a method of activating the surface of conductive metal particles by which they will react to form a single alloy and will more effectively wet the surface of the dielectric materials and therefore more completely cover such dielectric surface when they are sintered thereon.

In a primary aspect, the invention is directed to a method for activating the surface of finely divided particles of conductive metals having a thin surface coating of an oxide of the conductive metal comprising the steps of (a) treating the surface with an aqueous solution of a reducing agent for the oxide, when the conductive metal is a noble metal, and either a reducing agent for the oxide or an inorganic acid capable of reacting with the oxide to form a water-soluble salt thereof, when the conductive metal is a base metal, the reactive component of the aqueous solution being in molar excess of the oxide; (b) washing the surface of the treated particles with an aqueous liquid having a pH of 5.5–7.0 until essentially no change in pH takes place in the wash liquid; and (c) drying the surface of the washed particles.

In a second aspect, the invention is directed to a metallization comprising finely divided particles of conductive metal having a thin surface layer which is the reaction product of an atmospheric oxide of the conductive metal with a reducing agent, when the conductive metal is a noble metal, and an inorganic acid, when the conductive metal is a base metal, and to dispersions of such metallizations in organic media to make them printable.

DETAILED DESCRIPTION OF THE INVENTION

Conductive Metal

Figure 1:
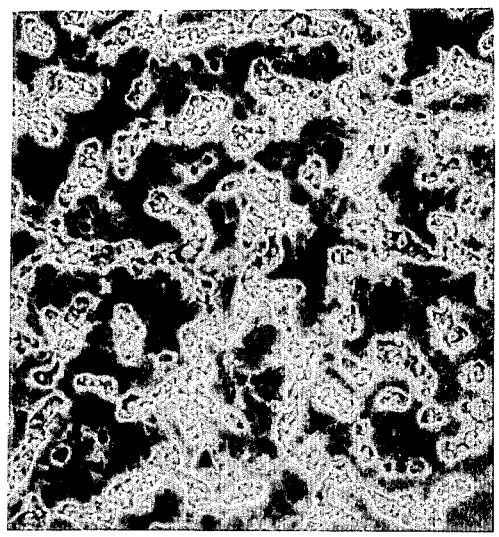
FIG. 1 is a photograph of an electrode-covered dielectric surface in which the metal component of the electrode layer has not been treated in accordance with the method of the invention.
Figure 2:
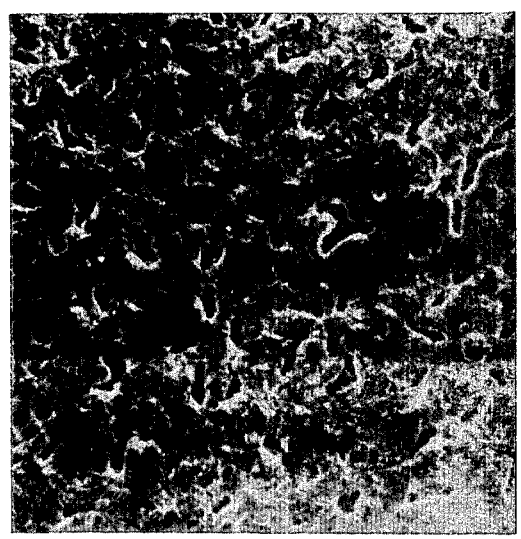
FIG. 2 is a photograph of an electrode-covered dielectric surface in which the metal component of the electrode layer has been treated in accordance with the method of the invention. Both of the photographs were taken at 600×magnification by the use of a scanning electron microscope (SEM). The continuous area is the electrode layer and the discontinuous areas are the underlying dielectric layer.

The method of the invention can be used to treat a wide variety of normally solid conductive metals so long as the metals themselves are substantially inert during the treating process.

Noble metals to which the invention can be applied include silver, palladium, gold, and platinum. Mixtures and alloys of these materials can be used as well. By far the most widely used noble metals will be mixtures and alloys of palladium and silver, which are preferred because the palladium/silver alloy possesses an appropriate combination of technical properties and reasonable economy in multilayer capacitor (MLC) applications.

Base metals to which the invention can be applied include copper, nickel, tin, aluminum, antimony, titanium, vanadium, chromium, manganese, iron, cobalt, zinc, cadmium, and ruthenium. Mixtures and alloys of these metals can also be used.

The most important application of the invention is in the manufacture of multilayer capacitors in which, as described above, the conductive metal is used as the conductive phase of the electrode layers. For this reason, the particles of the conductive metal particles which are to be used in metallizations should be sufficiently small that their pastes can be used in conventional printing operations and the particles can be readily sintered. Furthermore, in the production of capacitors from green dielectric sheets, the presence of coarse particles in the inner electrode prints must be avoided lest they cause puncturing of the green dielectric sheets. Generally, the metallizations are such that at least 90% of the conductive metal particles is no greater than 5 microns in diameter. That is, their largest dimension is no greater than 5 microns. Average particle size is preferably 1-2 μm.

Treating Solution

As indicated above, either of two types of treating solutions may be used in the method of the invention, depending upon the nature of the conductive metal. That is, for the treatment of noble metals, a reducing agent is used and, for the treatment of base metals, either a reducing agent or an inorganic acid is used.

Suitable reducing agents for the metal oxide layers will be apparent to the ordinarily skilled chemist. These include such materials as ferrous sulfate, formaldehyde, formic acid, hydrazine, hydrazine hydrate, hydrazine sulfate, hypophosphorous acid, hydroquinone, hydroarylamine, sodium borohydride, sodium hydrosulfate, sulfurous acid, tartaric acid, zinc metal, and mixtures thereof. The choice of which one to use will largely be a matter of processing economy. The mixtures of reducing agents disclosed in U.S. Pat. No. 3,390,981 to L. C. Hoffman are also suitable in the method of the invention.

Suitable inorganic acids for the treatment of base metal oxide layers include nitric, sulfuric, and phosphoric acids, and mixtures thereof. Nitric acid is preferred.

The treating solutions suitable for the invention are aqueous solutions. The concentration of the treating agent in the treating solution is in theory not at all critical. However, it is an important aspect of the invention that whatever reaction product is formed on the conductive metal particles be as thin as possible to avoid excessive loss of conductive metal. Therefore, it is preferred to use dilute aqueous solutions of the treating agent. Because of the subsequent washing step, it is also preferred that the treating agent be essentially completely soluble in water.

Treating agent concentrations up to about 10% by weight of the total solution have been found to be appropriate. A concentration of 0.1-5.0% by weight is preferred. Irrespective of the concentration of the treating liquid, the amount of reducing agent or inorganic acid must be in molar excess of the oxide to effect complete removal.

The exact mechanism by which the treating solution acts upon the particles is not known with certainty. In some instances, it involves reaction of the reducing agent with the surface oxide to form a nascent metal surface. In turn, this nascent surface reacts with anions in the treating liquid and the thin layer of reaction product protects the nascent surface. During subsequent firing of the electrode layer, the reaction product either reacts with the dielectric materials or with inorganic oxides if they are present in the electrode. By this mechanism the nascent surface is regenerated and will readily alloy with the other metals in the system.

This phenomenon is illustrated by the use of $H_3PO_2$ on Pd/Ag powders which is believed to result in reduction of the surface oxide $PdO_x$ to form a highly active nascent metal surface which bonds with either phosphorous and/or phosphate radicals to protect the surface from oxidation. During firing the surface-phosphorous bond is broken. When the bond is broken, the released phosphorous is free to wet the metal surface and to be uniformly distributed by dissolving into the glass components of the dielectric material. The released phosphorous may even act as a sintering aid for the metal particles.

Wash Liquid

Virtually any aqueous liquid can be used as the washing medium so long as it has an appropriate pH to effect solubilization and removal of the unreacted treating agent from the surface of the treated conductive metal particles without reaction. Water itself is obviously the preferred material for reasons of economy. In any event, it is preferred that the initial pH of the wash liquid be in the range of 5.5-7.0.

The washing operation is best carried out by flushing the treated particles several times with small quantities of wash liquid. When the pH of the aqueous wash liquid remains unchanged, the degree of washing of the particles is sufficient. Upon drying the particles are then ready for use.

The drying step can be carried out in a wide variety of ways incuding either batch or continuous ovens having air circulation therethrough. The manner of drying is not at all critical so long as the drying temperature is low enough to avoid any significant reaction between the activated surface and atmospheric oxygen. A preferred temperature for drying Pd/Ag powder is below about 100° C.

In the examples which follow, the surface-activating action of the method of the invention is demonstrated by use of the treated conductive metal particles to fabricate multilayer capacitors. Therefore, the treated particles were formulated into a printable paste by mixing the particles with an inert organic medium. The paste was then used to prepare multilayer capacitors as described below and the resultant capacitors were then evaluated.

Capacitor Processing

As described above, most multilayer capacitors are fabricated by printing the electrode metallization in the desired pattern upon a dielectric substrate which is a green (unfired) tape of dielectric material particles bound together by an organic binder. The printed dielectric substrates are stacked, laminated, and cut to form the desired capacitor structure. The green dielectric material is then fired to effect removal of the organic medium from the electrode material and of the organic binder from the dielectric material. The removal of these materials is accomplished by a combination of evaporation and thermal decomposition during the firing operation. In some instances, it may also be desirable to interpose a preliminary drying step prior to firing.

The organic binder component of the dielectric tapes is ordinarily a flexible polymer of a lower alkyl acrylate or lower alkyl methacrylate such as methyl acrylate, methyl methacrylate and ethyl acrylate or mixtures thereof. Such polymers can, in some instances, contain plasticizers and other additives to impart particular flexibility and/or other physical properties to the binder polymer.

When firing the above described capacitor assemblages, it is preferred to employ a first firing step in which the assemblage is heated slowly to 100°–550° C., which will be effective to remove all of the organic material without damage to the laminated assemblage. Typically, the organic burnout period is 18–24 hours to assure complete removal of organics. When this has been completed, the assemblage is then heated more rapidly to the desired sintering temperature.

The desired sintering temperature is determined by the physical and chemical characteristics of the dielectric material. Ordinarily the sintering temperature will be chosen to obtain maximum densification of the dielectric material. For barium titanate-based dielectric systems, this temperature will range from 1100°–1450° C. Sintering times also vary with the dielectric compositions, but ordinarily on the order of two hours at the sintering temperature is preferred.

Upon completion of sintering, the rate of cooling to ambient temperature is carefully controlled in accordance with resistance of the components to thermal shock.

The following properties which are relevant to the ability of a given capacitor to function properly are referred to in the examples.

Capacitance

Capacitance is a measure of the capability of a material to store an electrical charge expressed mathematically, $C = KAN$ divided by $t$, where $A$ equals area overlap of electrodes, $t$ is thickness of dielectric layer, $K$ is dielectric constant, and $N$ is number of dielectric layers.

The units of capacitance are farads or fractions thereof such as microfarads ($10^{-6}$ farad nanofarads, $10^{-9}$ farad or picofarads $10^{-12}$ fared).

Dissipation Factor

Dissipation Factor (DF) is a measure of the phase difference between voltage and current. In a perfect capacitor, the phase difference would be 90°. However, in practical dielectric systems, DF is less than 90° because of leakage and relaxation losses. In particular, DF is the tangent of the angle by which the current lags the 90° vector.

Insulation Resistance

Insulation resistance (IR) is a measure of the ability of a charge capacitor to withstand leakage in DC current. Insulation resistance is a constant for any given dielectric regardless of capacitance.

Dielectric Strength

This is defined as the voltage gradient which produces electrical breakdown or "flash" failure. It is a function of the material and thickness of the dielectric layer tested.

Electrode Array

This is qualitative microscopic evaluation of the integrity or uniformity of the electrode layers. Such factors as continuity, waviness, uniformity of thickness are considered qualitatively.

Ink Definition

This is a qualitative microscopic evaluation of the sharpness or resolution of the interface between the electrode and dielectric layers.

Electrode-Dielectric Delamination

This is a qualitative microscopic evaluation of the fired capacitor with respect to which may have taken place between the electrode and dielectric layers.

Electrode-Termination Interface

This is a qualitative microscopic evaluation of the uniformity of the interface between the electrode layers and the termination.

The following examples and comparative showings are presented to illustrate the advantages of the present invention. In the examples and elsewhere in the specification and claims, all parts, percentages, proportions, etc., are by weight, unless otherwise stated.

EXAMPLE 1

Three hundred grams of commercially available palladium and silver powders in a weight ratio of 30 palladium to 70 silver were mixed and soaked in a bath containing 900 ml. of 5% $H_3PO_2$ (5 ml of acid in 100 ml of distilled water) for 30–40 minutes. The samples were stirred continuously using a polyethylene stirrer. At the end of the soaking period, the metal powders were filtered out and washed with distilled water to a constant pH of 6.3 (equal to the pH of the distilled water used for washing). The powder was dried at 80°–90° C. until all the water had been removed and then dry-milled using plastic bottles and balls. The dried powder was then stored in plastic containers.

Emission spectroscopic analysis of the powder mixture showed the presence of over 1000 ppm phosphorus. The amount of phosphorus in the treated powder (% by weight) increased when the ratio of palladium to silver was increased.

EXAMPLES 2–5

A quantity of the Pd/Ag powder prepared by the method of Example 1 was dispersed in organic medium to form a series of printable thick film pastes. Each of the above-described pastes, as well as a further paste formulated from untreated Pd/Ag powders, was used to prepare a series of over 1000 26-layer capacitors 17 mm in length by 6 mm in width. Each of the formulations was used to make capacitors for both NPO- and X7R-type dielectric tapes. The data from the NPO capacitors are given in Table 1, and the data from the X7R capacitors are given in Table 2 below.

TABLE 1

| EFFECT OF SURFACE TREATMENT ON NPO CAPACITOR PROPERTIES | | | |
|---|---|---|---|
| Example No. | Control | 2 | 3 |
| Composition, % Wt. | | | |
| Pd/Ag Powder, 30/70 | 50 | 50 | 45 |
| Organic Medium | 50 | 50 | 55 |
| Electrical Properties | | | |
| Capacitance (NF) | 3.5 | 3.5 | 3.5 |
| DF (%) | $<1 \times 10^{-2}$ | $<1 \times 10^{-2}$ | $<1 \times 10^{-2}$ |
| IR ($\Omega$) | $>1 \times 10^{11}$ | $>1 \times 10^{11}$ | $>1 \times 10^{11}$ |
| Dielectric Strength (V) | >250 | >250 | >250 |
| Electrode Array | Good | Good | Good |

TABLE 1-continued
EFFECT OF SURFACE TREATMENT
ON NPO CAPACITOR PROPERTIES

| Example No. | Control | 2 | 3 |
|---|---|---|---|
| Ink Definition | Good | Good | Good |
| Electrode-Dielectric Delamination | 25% | None | None |
| Electrode-Termination Interface | Satisfactory | Good | Good |
| Yield, % | 75 | 100 | 100 |

TABLE 2
EFFECT OF SURFACE TREATMENT
ON X7R CAPACITOR PROPERTIES

| Example No. | Control | 4 | 5 |
|---|---|---|---|
| Composition, % Wt. | | | |
| Pd/Ag Powder, 30/70 | 50 | 50 | 45 |
| Organic Medium | 50 | 50 | 55 |
| Electrical Properties | | | |
| Capacitance (NF) | 96.0 | 99.0 | 95.8 |
| DF (%) | 2.0 | 1.8 | 1.7 |
| IR ($\Omega$) | $>1 \times 10^{11}$ | $>1 \times 10^{11}$ | $>1 \times 10^{11}$ |
| Dielectric Strength (V) | >125 | >125 | >125 |
| Electrode Array | Good | Good | Good |
| Ink Definition | Good | Good | Good |
| Electrode-Dielectric Delamination | 25% | None | None |
| Electrode-Termination Interface | Satisfactory | Good | Good |
| Yield, % | 75 | 100 | 100 |

The foregoing data show that for both capacitor types the method of the invention was quite effective in improving the integrity of the interface between the electrode layer and the dielectric layer and markedly improved the capacitor yield from 75% to 100%.

EXAMPLE 6

The paste described in Example 2 was used to prepare a further series of over 1000 two-layer capacitors of 17 mm in length by 6 mm in width. A control paste composition was then prepared which was identical in composition to the test paste except that the metal powder mixture had not been treated with reducing agent. These Formulations were then used to make single print-single plate capacitors from NPO-type dielectric tapes. The data from the capacitors are given in Table 3 below.

TABLE 3
EFFECT OF SURFACE TREATMENT
ON SINGLE-PLATE CAPACITOR PROPERTIES

| Example No. | Control | 4 |
|---|---|---|
| Composition, % Wt. | | |
| Pd/Ag Powder, 30/70 | 50 | 50 |
| Organic Medium | 50 | 50 |
| Electrical Properties | | |
| Capacitance (NF) | 0 | 97.4 |
| DF (%) | — | $<1 \times 10^{-2}$ |
| IR ($\Omega$) | — | $>1 \times 10^{11}$ |
| Dielectric Strength (V) | — | >250 |
| Electrode Array | Not Good | Good |
| Ink Definition | Not Good | Good |
| Electrode-Dielectric Delamination | — | None |
| Electrode-Termination Interface | — | Good |
| Yield, % | 0 | 100 |

The foregoing data show that it was impossible to make a satisfactory single print-single plate capacitor from the control, but with the invention paste, in which the surface of the metal powders had been treated with $H_3PO_2$ reducing agent, a quite satisfactory capacitor was obtained with only the single print. The control data show that at least two and perhaps three prints would be required to obtain a passable single plate capacitor from the untreated metal powders. Thus the treated metallizations of the invention are much more economical and reliable than their untreated counterparts for use in making single print-single plate capacitors.

I claim:

1. A method for activating the surface of finely divided particles of conductive metals having a thin surface coating of oxide of the conductive metal comprising the steps of (a) treating the surface with an aqueous solution of a reducing agent for the oxide when the conductive metal is a noble metal and either a reducing agent for the oxide or an inorganic acid capable of reacting with the oxide to form a water-soluble salt of the metal ion when the conductive metal is a base metal, the reactive component of the aqueous solution being in molar excess of the oxide, (b) washing the surface of the treated particles with an aqueous liquid having a pH of 5.5–7.0 until essentially no change in pH takes place in the wash liquid, and (c) drying the surface of the washed particles.

2. The method of claim 1 in which the conductive metal is a noble metal selected from the group consisting of palladium, gold, silver and mixtures and alloys thereof, and the reactive component of the aqueous treating solution is a reducing agent for the oxide.

3. The method of claim 2 in which the conductive metal is a mixture of palladium and silver and the reducing agent is $H_3PO_2$.

4. The method of claim 1 in which the conductive metal is a base metal selected from the group consisting of aluminum, copper, nickel, and mixtures and alloys thereof and the rective component of the aqueous treating solution is reactive with the oxide to form a water-soluble salt of the metal ion.

5. The method of claim 4 in which the inorganic acid is selected from the group consisting of $HNO_3$, $H_2SO_4$, and phosphorus acids.

6. The method of claim 1 in which the conductive metal is a base metal selected from the group consisting of copper, nickel, aluminum and mixtures and alloys thereof, and the reactive component of the aqueous treating solution is a reducing agent for the conductive metal oxide.

7. The method of claim 6 in which the reducing agent is $H_3PO_2$.

8. The method of claim 1 in which the concentration of the reactive compound in the aqueous treating solution does not exceed 10% by weight of the solution.

* * * * *